United States Patent

Moroz et al.

(10) Patent No.: US 9,472,423 B2
(45) Date of Patent: Oct. 18, 2016

(54) METHOD FOR SUPPRESSING LATTICE DEFECTS IN A SEMICONDUCTOR SUBSTRATE

(75) Inventors: Victor Moroz, Saratoga, CA (US); Dipankar Pramanik, Saratoga, CA (US)

(73) Assignee: SYNOPSYS, INC., Mountain View, CA (US)

(*) Notice: Subject to any disclaimer, the term of this patent is extended or adjusted under 35 U.S.C. 154(b) by 981 days.

(21) Appl. No.: 11/928,142

(22) Filed: Oct. 30, 2007

(65) Prior Publication Data

US 2009/0108293 A1  Apr. 30, 2009

(51) Int. Cl.
| | |
|---|---|
| H01L 21/324 | (2006.01) |
| H01L 21/265 | (2006.01) |
| H01L 29/10 | (2006.01) |
| H01L 29/78 | (2006.01) |

(52) U.S. Cl.
CPC ....... *H01L 21/324* (2013.01); *H01L 21/26506* (2013.01); *H01L 29/1054* (2013.01); *H01L 29/1079* (2013.01); *H01L 29/7848* (2013.01); *H01L 21/26513* (2013.01)

(58) Field of Classification Search
USPC ................. 438/197, 226, 301; 257/E21.631, 257/E27.061
See application file for complete search history.

(56) References Cited

U.S. PATENT DOCUMENTS

| | | | |
|---|---|---|---|
| 4,769,686 A | 9/1988 | Horiuchi et al. | |
| 5,098,852 A | 3/1992 | Niki et al. | |
| 5,592,012 A | 1/1997 | Kubota | |
| 5,966,622 A | 10/1999 | Levine et al. | |
| 5,985,726 A | 11/1999 | Yu et al. | |
| 6,180,476 B1 * | 1/2001 | Yu | 438/305 |
| 6,200,869 B1 | 3/2001 | Yu et al. | |
| 6,225,173 B1 | 5/2001 | Yu | |
| 6,437,406 B1 | 8/2002 | Lee | |
| 6,590,230 B1 | 7/2003 | Yamazaki et al. | |
| 6,594,809 B2 | 7/2003 | Wang et al. | |
| 6,618,847 B1 | 9/2003 | Hulse et al. | |
| 6,682,965 B1 | 1/2004 | Noguchi et al. | |
| 6,685,772 B2 | 2/2004 | Goddard, III et al. | |
| 6,689,671 B1 * | 2/2004 | Yu et al. | 438/486 |
| 7,032,194 B1 | 4/2006 | Hsueh et al. | |

(Continued)

FOREIGN PATENT DOCUMENTS

| | | |
|---|---|---|
| JP | 03-038044 | 2/1991 |
| JP | 08-078682 | 3/1996 |

(Continued)

OTHER PUBLICATIONS

"Crystalline Defects in Silicon," web pp. 1-3, from http://www.siliconfareast.com/crystaldefects.htm (2006).

(Continued)

*Primary Examiner* — Daniel Whalen
(74) *Attorney, Agent, or Firm* — Haynes Beffel & Wolfeld LLP

(57) ABSTRACT

A method for suppressing the formation of leakage-promoting defects in a crystal lattice following dopant implantation in the lattice. The process provides a compressive layer of atoms, these atoms having a size greater than that of the lattice member atoms. The lattice is then annealed for a time sufficient for interstitial defect atoms to be emitted from the compressive layer, and in that manner energetically stable defects are formed in the lattice at a distance from the compressive layer.

8 Claims, 6 Drawing Sheets

(56) References Cited

U.S. PATENT DOCUMENTS

| | | | |
|---|---|---|---|
| 7,084,051 | B2 | 8/2006 | Ueda et al. |
| 7,174,532 | B2 | 2/2007 | Chlipala et al. |
| 7,259,079 | B2 | 8/2007 | Bai et al. |
| 7,404,174 | B2 | 7/2008 | DeMaris et al. |
| 7,484,198 | B2 | 1/2009 | Lin et al. |
| 7,514,366 | B2 | 4/2009 | Trivedi et al. |
| 7,521,763 | B2 | 4/2009 | Kim et al. |
| 7,538,351 | B2 | 5/2009 | Chen et al. |
| 7,605,407 | B2 | 10/2009 | Wang |
| 2001/0011362 | A1 | 8/2001 | Yoshinaga |
| 2002/0022326 | A1 | 2/2002 | Kunikiyo |
| 2002/0138817 | A1 | 9/2002 | Lee et al. |
| 2005/0029601 | A1 | 2/2005 | Chen et al. |
| 2005/0035409 | A1 | 2/2005 | Ko et al. |
| 2005/0044522 | A1 | 2/2005 | Maeda |
| 2005/0076320 | A1 | 4/2005 | Maeda |
| 2005/0106824 | A1 | 5/2005 | Alberto et al. |
| 2005/0151181 | A1 | 7/2005 | Beintner et al. |
| 2005/0216877 | A1 | 9/2005 | Pack et al. |
| 2006/0017138 | A1 | 1/2006 | Ting |
| 2006/0046415 | A1* | 3/2006 | Hamaguchi ............... 438/373 |
| 2006/0107243 | A1 | 5/2006 | Chlipala et al. |
| 2006/0160338 | A1 | 7/2006 | Graoui et al. |
| 2006/0199398 | A1 | 9/2006 | Sugawara et al. |
| 2007/0045610 | A1 | 3/2007 | Lee et al. |
| 2007/0117326 | A1* | 5/2007 | Tan et al. ............... 438/266 |
| 2007/0123010 | A1 | 5/2007 | Hoentschel et al. |
| 2007/0130553 | A1 | 6/2007 | Wang et al. |
| 2007/0173022 | A1 | 7/2007 | Wang et al. |
| 2007/0202663 | A1 | 8/2007 | Moroz et al. |
| 2007/0204250 | A1 | 8/2007 | Moroz et al. |
| 2008/0005712 | A1 | 1/2008 | Charlebois et al. |
| 2008/0265361 | A1 | 10/2008 | Krauss |
| 2009/0007043 | A1 | 1/2009 | Lin et al. |
| 2009/0047772 | A1 | 2/2009 | Tsuchida et al. |
| 2009/0055793 | A1 | 2/2009 | Melzner |
| 2009/0302349 | A1 | 12/2009 | Lee et al. |
| 2009/0313595 | A1 | 12/2009 | Moroz et al. |

FOREIGN PATENT DOCUMENTS

| | | |
|---|---|---|
| JP | 11-168069 | 6/1999 |
| JP | 2002-524845 A | 8/2002 |
| JP | 2004-014856 A | 1/2004 |
| WO | 0013211 | 3/2000 |
| WO | 03 049163 | 6/2003 |
| WO | 2006-064282 A2 | 6/2006 |

OTHER PUBLICATIONS

International Search Report mailed Oct. 29, 2008 in PCT/US2008/071572.

Griffin, P. B. et al., "Process Physics Determining 2-D Impurity Profiles in VLSI Devices," IEEE, 1986, pp. 522-525.

H. Fukutome et al., "Direct Measurement of Effects of Shallow-Trench Isolation on Carrier Profiles in Sub-50 nm N-MOSFETSs," 2005 Symposium on VLSI Technology Digest of Technical Papers, pp. 140-141.

Moroz, Victor et al., "Suppressing Layout-Induced Threshold Variations by Halo Engineering," presented at 210 th Meeting of the Electrochemical Society, Cancun, Mexico, Oct. 29-Nov. 3, 2006, 6 pp.

International Search Report for PCT/US08/51358 mailed Jun. 27, 2008.

Non-Final Rejection mailed Jan. 23, 2009 in U.S. Appl. No. 11/757,294.

International Search Report for PCT/US2008/071579 mailed Feb. 20, 2009.

First Office Action mailed Jun. 24, 2010 in U.S. Appl. No. 11/926,485.

First Office Action, mailed Sep. 16, 2010 in U.S. Appl. No. 12/577,022.

Office Action issued by SIPO Aug. 23, 2010 in, no references cited.

Final Office Action mailed Feb. 4, 2011 in U.S. Appl. No. 11/926,485

Final Office Action mailed Feb. 7, 2011 in U.S. Appl. No. 12/577,022.

Extended European Search Report mailed Mar. 26, 2012 for EP application No. 08796849.1.

EPO Supplementary Search Report for EP 08782517.0 mailed Apr. 25, 2012, 6 pp.

Zemke, "Numerical Analysis of Parasitic Effects in Deep Submicron Technologies", SNUG San Jose 2005, available at http://www.synopsys.com/sps/pdfizemke_final.pdf, visited Oct. 4, 2007.

Loke, "Introduction to Deep Submicron CMOS Device Technology", Powerpoint presentation, May 3, 2005, available at http://www.engr.colostate.edu/EE571/Files/2005_05_03_CSU.pdf, visited Oct. 4, 2007.

Kanda Y., "A Graphical Representation of the Piezoresistance Coefficients in Silicon," IEEE Transactions on Electron Devices, vol. ED-29(1), 1982, pp. 64-70.

Xuemei (Jane) Xi, et al., "BSIM4.3.0 Model, Enhancements and Improvements Relative to BSIM4.2.1", University of California at Berkeley (2003) available at http://www-devices.eecs.berkeley.edu/~bsim3/BSIM4/BSIM430/doc/BSIM430_Enhancement .pdf.

R.A. Bianchi et al., "Accurate Modeling of Trench Isolation Induced Mechanical Stress Effects on MOSFET Electrical Performance," IEEE IEDM Tech. Digest, pp. 117-120 (Dec. 2002).

Shah N., "Stress Modeling of Nanoscale MOSFET," A Thesis Presented to Graduate School of Univ. of Florida, University of Florica, 2005.

S.E. Thompson et al., "A 90-nm Logic Technology Featuring Strained-Silicon", IEEE Transactions on Electron Devices, 2004.

F. Nouri et al., "A Systematic Study of Trade-offs in Engineering a Locally Strained pMOSFET", Proc. IEDM, pp. 1055-1058, 2004.

G. Eneman et al, "Layout Impact on the Performance of a Locally Strained PMOSFET," 2005 Symposium on VLSI Technology Digest of Technical Papers, pp. 22-23, 2005.

V. Moroz et al., "Analyzing strained-silicon options for stress-engineering transistors", Solid State Technology, Jul. 2004.

C.S. Smith, "Piezoresistance Effect in Germanium and Silicon", Physical Review, vol. 94, No. 1, Apr. 1, 1954.

Smith, et al., "Exploring the Limits of Stress-Enhanced Hole Mobility", IEEE Electron Device Letters, vol. 26, No. 9, Sep. 2005.

Moroz, et al., "Options at the 45 nm node include engineered substrates", Solid State Technology, Jul. 2005.

Houghton et al., "Equilibrium Critical Thickness for Si1-xGex Strained Layers on (100)Si," Appl. Phys. Lett. 56, pp. 460-462 (1990).

Mii et al., "Extremely High Electron Mobility in Si/GexSil-x Structures Grown by Molecular Beam Epitaxy," Appl. Phys. Lett. 59, pp. 1611-1613 (1991).

Mii et al., "Extremely High Electron Mobility in Si/GexSil-x Structres Grown by Molecular Beam Epitaxy,"Appl. Phys. Lett. 59, 1611 (1991).

Houghton et al., "Equilibrium Critical Thickness for Si1-xGex Strained Layers on (100)Si," Appl. Phys. Lett. 56, 460 (1990); 3 pages.

People et al., "Calculation of Critical Layer Thickness Versus Lattice Mismatch for GexSi1-x/Si Strained—Layer Heterostructures," Appl. Phys. Lett. 47, 322 (1985); 3 pages.

* cited by examiner

Probabilities to jump in either direction are equal 200
201

Interstitials are driven out of compressed Si

Compressed Si

201

Relaxed Si

200

US 9,472,423 B2

METHOD FOR SUPPRESSING LATTICE DEFECTS IN A SEMICONDUCTOR SUBSTRATE

BACKGROUND OF THE INVENTION

The present invention relates to the field of semiconductor fabrication. In particular, it relates to the fabrication of field effect transistors (FETs), involving the formation of semiconductor materials of selected conductivity, carried on by implantation of dopants.

Fabrication of metal oxide semiconductor (MOS) FETs requires the formation of source and drain regions in a substrate of generally pure silicon (Si). The Si is provided in the form of a wafer, grown as a single crystal. Zones of the Si lattice are converted into regions of N or P conductivity by the addition of donor-type dopants, such as arsenic, for N regions, and acceptor-type dopants, such as boron, for P regions. These dopants are generally introduced by ion bombardment, in which ionized dopant atoms are energized and fired at the lattice, penetrating the crystal structure to a depth largely dependent on the bombardment energy and the ion mass.

It can be immediately gathered that such bombardment introduces crystal damage, in which lattice atoms are knocked out of lattice sites, while at the same time a certain number of the newly-introduced atoms will likewise come to rest in positions outside the lattice positions. Such out-of-position phenomena are termed defects. A vacant lattice site is termed a vacancy defect, while an atom located at a non-lattice site is referred to as an interstitial defect. The restorative method generally employed in the art consists of annealing the crystal, applying heat to the lattice to mildly energize the atoms, allowing them to work themselves back into the lattice structure, which provides the arrangement having the lowest overall energy level.

SUMMARY OF THE INVENTION

An aspect of the claimed invention is a method for suppressing the formation of leakage-promoting defects in a crystal lattice following dopant implantation in the lattice. The process provides a compressive layer of atoms, these atoms having a size greater than that of the lattice member atoms. The lattice is then annealed for a time sufficient for interstitial defect atoms to be emitted from the compressive layer, and in that manner energetically stable defects are formed in the lattice at a distance from the compressive layer.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
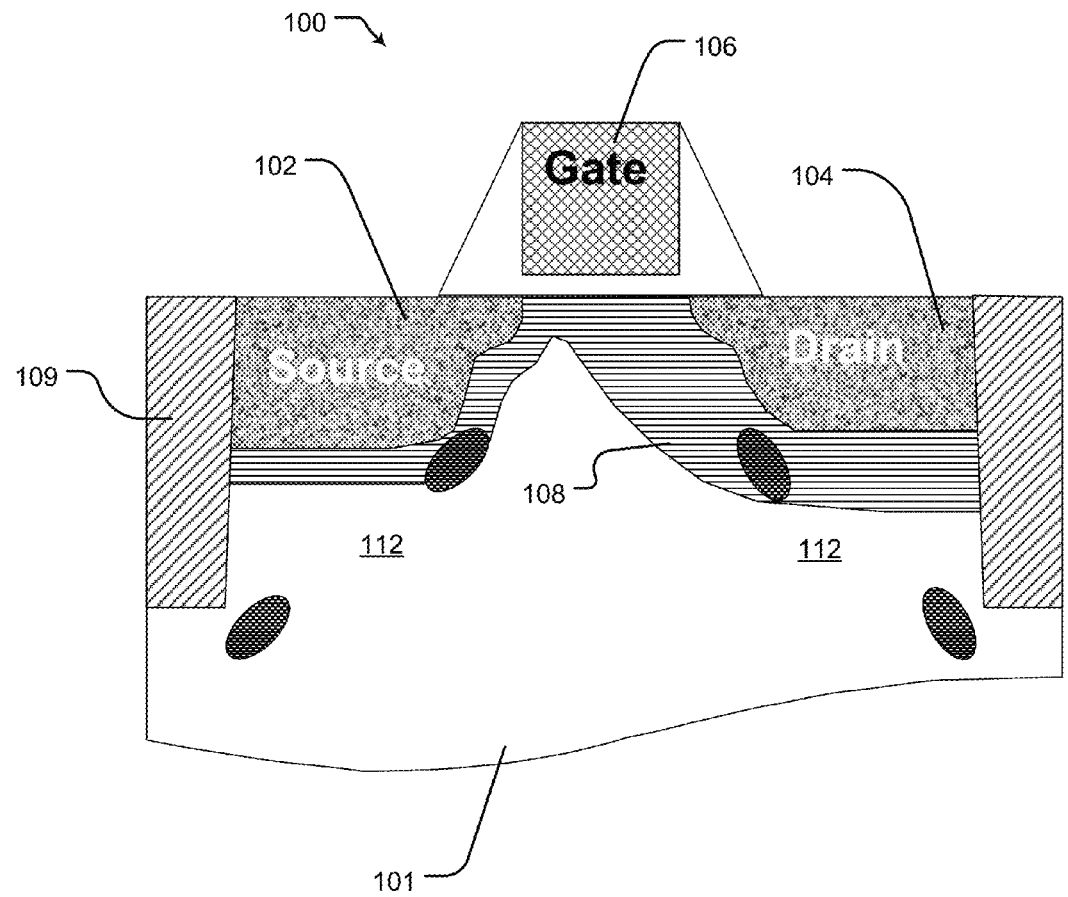
FIG. 1 illustrates manner in which the problem of stress-induced defect formation occurs in a semiconductor substrate.

The problem addressed by the present disclosure is seen in FIG. 1, which depicts a typical MOSFET 100 after undergoing ion implantation. The transistor is formed on a silicon substrate 101 and includes source 102, drain 104 and gate 106. The depletion layer 108 adjacent each electrode and extending across the channel between the source and drain, is well known in the art. The depicted cell is one member of an array that can encompass millions of cells, as known in the art, and the cell is separated from other members of the array by Shallow Trench Isolators (STI) 109, filled with dielectric fill material.

The source and drain are formed in the silicon substrate by the implantation of dopants, as known in the art, and the implantation process produces defects in the lattice, which defects are addressed by annealing the substrate after implantation. While most defects are removed by annealing, some will coalesce into larger defects 112, often in the form of dislocation loops or area defects. These defects are generally collections of interstitial silicon atoms, knocked out of their lattice positions by dopant atoms. It has been found that large defects 112 tend to form more readily in portions of the substrate that either have no mechanical stress on the lattice, or preferably, where the lattice is subjected to tensile stress. For example, locations where the lattice passes around a convex point in an underlying strained structure, such as around corners in the SiGe source, SiGe drain and STI's, tend to favor the accumulation of defects, resulting in the situation seen in FIG. 1, where defects 112 are seen at the corners of the source and drain as well as the corners of the STI's.

Figure 2:
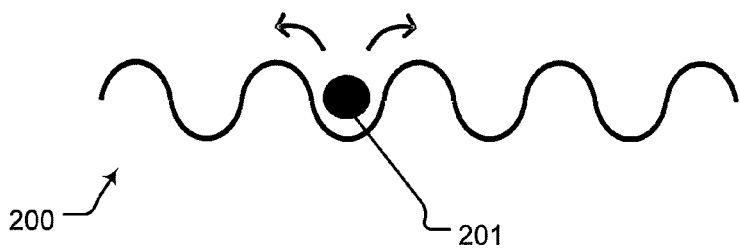
FIG. 2 schematically depicts the solution of the claimed invention.
Figure 2:
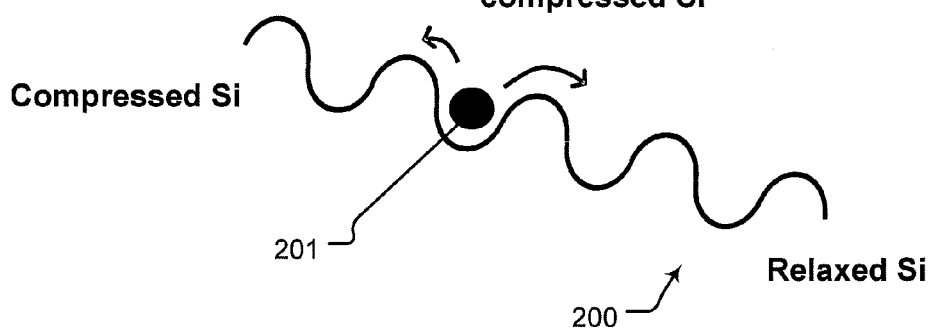

FIG. 2 illustrates an analogy to the mechanism at work in this situation. In each portion of the drawing, the lattice 200 is represented as having lattice sites, corresponding to the peaks in the figure, where an interstitial atom 201 can come to rest in between the lattice atoms, requiring some expenditure of energy to move to another interstitial position. In the upper portion of the drawing, the energy required to move to either side is identical, corresponding to the situation in an unstressed lattice. Probabilities of moving either left or right in the drawing are equal. The bottom portion of the drawing, however, shows one end of the line is higher than the other, analogous to the situation in which one portion of the lattice is subjected to compressive stress and the other is relaxed. Here, movement "uphill" toward the compressive stress clearly requires more energy than movement "downhill" toward the relaxed portion of the lattice. Thus, movement toward relaxed portions of the lattice, such as locations where the lattice is stressed by bending around a corner, are energetically favorable and will tend to collect more defects than compressively stressed areas.

Figure 3:
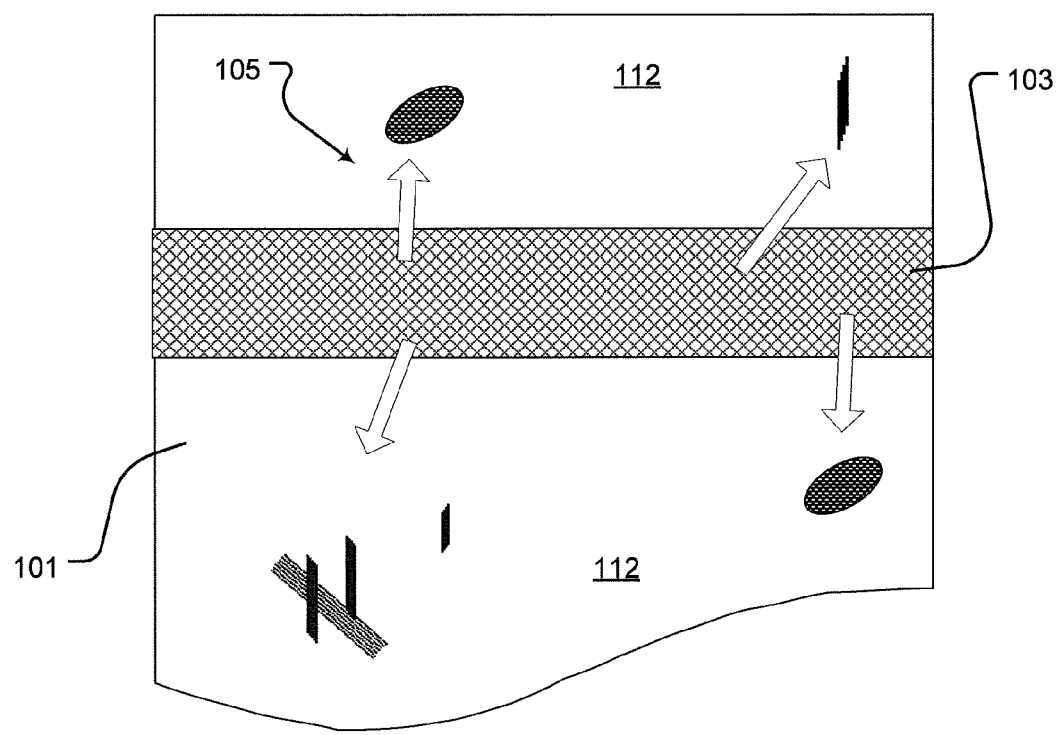
FIG. 3 illustrates the mechanism by which the method of the presently claimed invention suppresses defects in a semiconductor substrate.

A conceptual view of the operation of the claimed invention is seen in FIG. 3. There, along with the implantation of dopants, a compressive layer 103 of atoms having a larger size than silicon, being higher on the periodic table, is implanted in the substrate. Germanium, lying directly below silicon in the periodic table, is a preferred element for this purpose. That layer produces an area of higher compression, causing a net migration of defects away from the compressive layer, indicated by arrows 105. After annealing, the structure formed by this process contains a number of large defects 112, in the form of area, line or dislocation loop defects, but all such defects occur outside the compressive layer.

Figure 4:
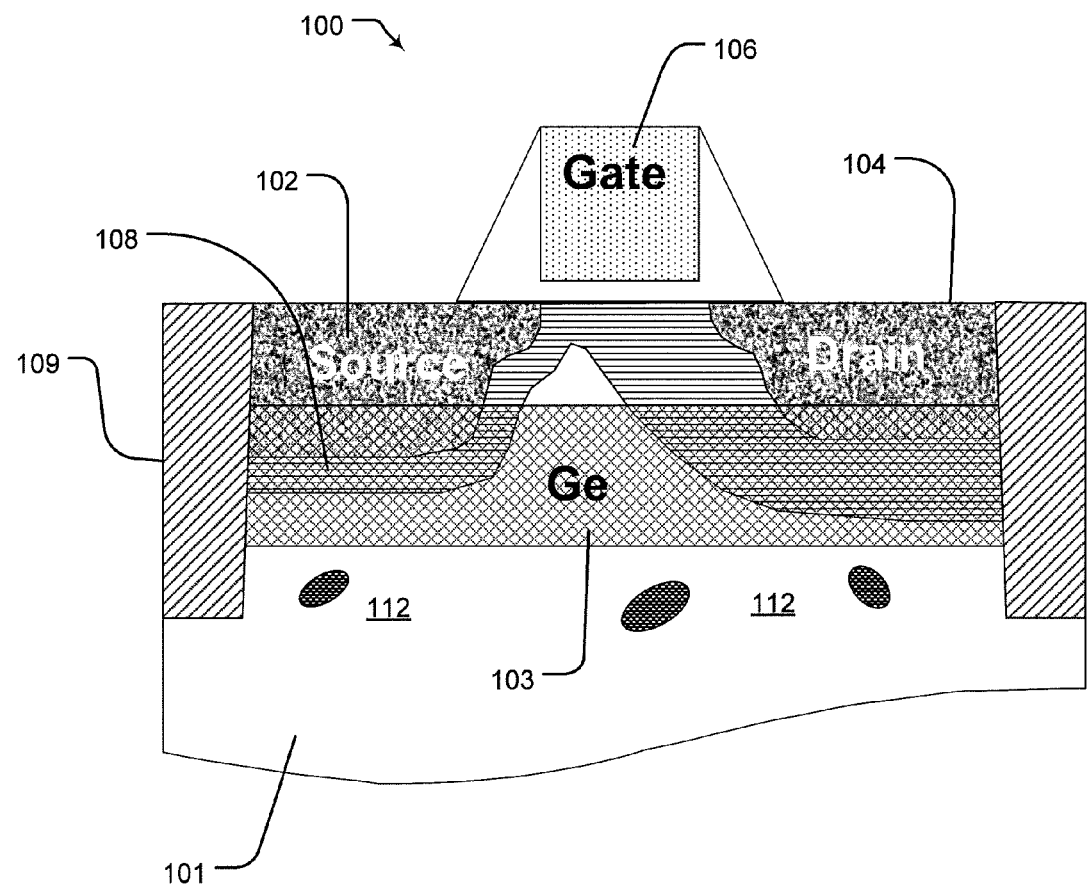
FIG. 4 depicts an embodiment of a semiconductor formed in accordance with the claimed invention.

FIG. 4 illustrates an embodiment of the presently claimed invention in a transistor 100, with elements as set out above in connection with FIG. 1. Here, however, a compressive layer 103 of germanium is formed along with the dopant atoms. The germanium can be co-implanted—implanted at the same time—along with the dopants, or a layer of Ge can be epitaxially grown during formation of the substrate. Both of these techniques are effective in the illustrated context, and both are well-known in the art. Neither is particularly preferred, and thus the user can choose which process to employ based on other factors.

Most importantly, defects 112 are all located outside the compressive layer, and thus away from the depletion layer 108. Confined to portions of the substrate where they cannot form a leakage path, these defects are rendered entirely harmless.

An alternative embodiment locates the compressive layer at least partially within the depletion layer, as seen in FIG. 4. The exact position can lie entirely within the layer, or overlapping it. The primary goal of the compressive layer is to protect the depletion layer from defect formation, so having the compressive layer within the depletion layer altogether prevents the formation of defects there.

Figure 5:
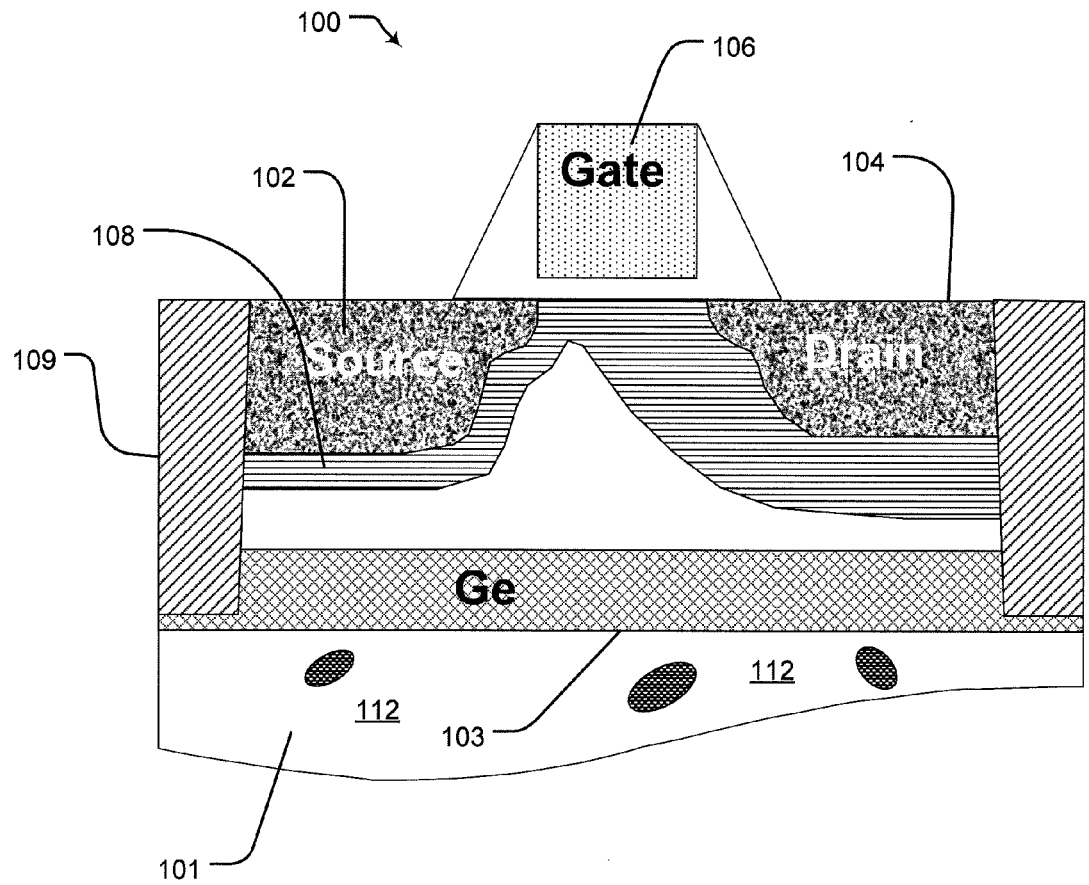
FIG. 5 depicts an alternate embodiment of a semiconductor formed in accordance with the claimed invention.

The optimum solution calls for the compressive layer 103 to lie entirely outside the depletion layer, between the depletion layer and the defects 112, as shown in FIG. 5. There, the compressive layer is positioned to prevent the movement of intersitials toward or into the depletion layer, completely precluding defect formation there.

Figure 6:
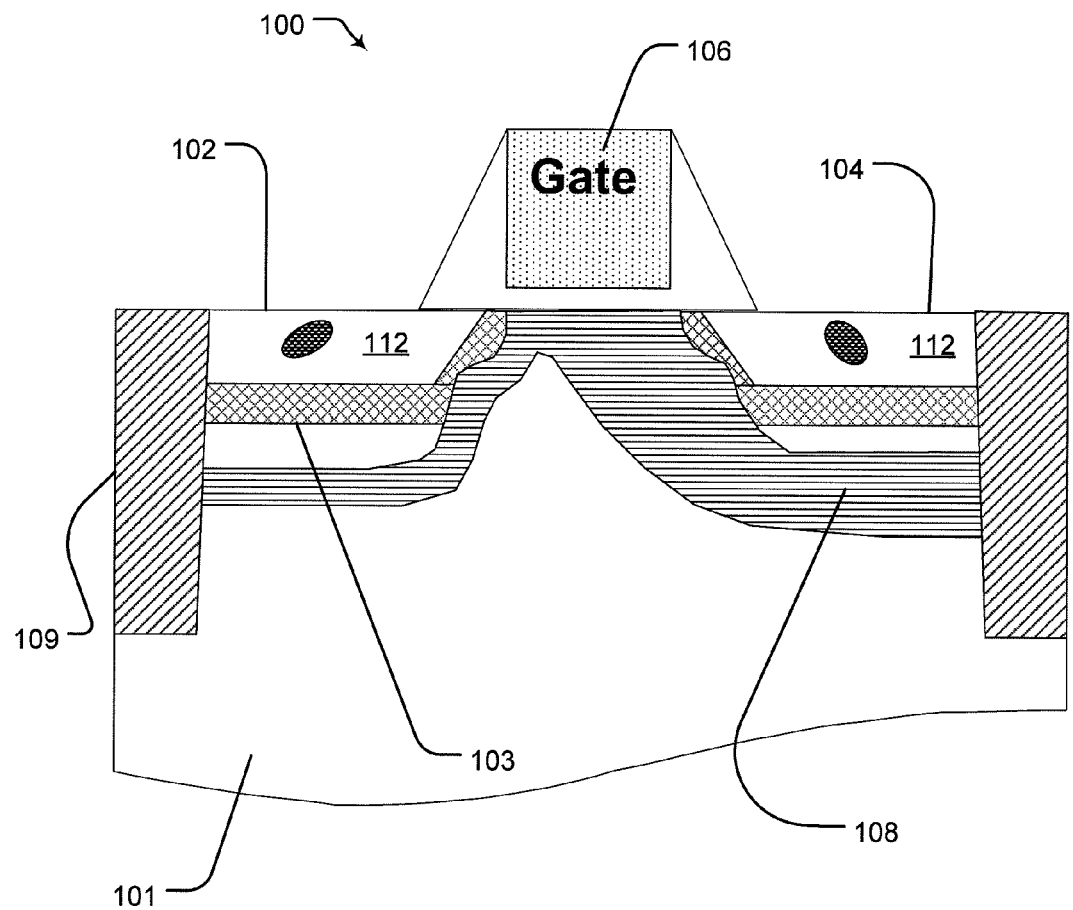
FIG. 6 depicts a further alternate embodiment of a semiconductor formed in accordance with the claimed invention.

Another embodiment, shown in FIG. 6, positions the compressive layer 103 at a level shallower than that of the depletion layer 108. Here, those in the art will understand that it would not be desirable to have the compressive layer extend into channel, and thus the compressive layer would be implanted after implantation of the source and drain regions 102 and 104, and like those operations, the gate structure would be employed as a mask, as known in the art. Thus, the compressive layer would lie wholly within the source and drain regions, as shown. As will be understood, the shape of the compressive layer will have substantially the same profile as does the source or drain region containing that layer, a fact that may not be clear from the drawing. Here, defects would form in the source and drain regions.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim as follows:

1. During fabrication of a semiconductor device on a crystal substrate, the semiconductor device having source and drain regions, with a channel between the source and drain regions and a gate conductor positioned above the channel, a method for suppressing the formation of leakage-promoting defects in a crystal lattice due to dopant implantation in the lattice, comprising:
   providing impurity atoms within the substrate, more deeply than the source and drain regions within the lattice, the impurity atoms being selected to impose a compressive stress on the crystal lattice, at least some of the impurity atoms being directly below at least part of the gate conductor;
   implanting dopant atoms into the lattice; and
   after implanting the dopant atoms into the lattice, annealing the lattice to thereby cause compressive stress exerted by the impurity atoms on the lattice, including those of the impurity atoms directly below at least part of the gate conductor, to emit interstitial defect atoms from a region containing the impurity atoms.

2. The method of claim 1, wherein the impurity atoms are larger than the lattice member atoms of the crystal substrate.

3. The method of claim 1, wherein the impurity atoms are electrically neutral.

4. The method of claim 1, wherein the impurity atoms are disposed to impose the compressive stress below at least part of the crystal substrate in which compressive stress is not imposed by the impurity atoms.

5. The method of claim 1, wherein the lattice member atoms of the crystal substrate are silicon, and the impurity atoms are germanium.

6. The method of claim 1, wherein the impurity atoms at least partially subsume a convex corner of a source or drain region within the lattice.

7. The method of claim 1, wherein the impurity atoms are all disposed more deeply than source and drain regions within the lattice.

8. The method of claim 1, wherein the impurity atoms extend between the source region and the drain region.

* * * * *